(12) United States Patent
Kim

(10) Patent No.: US 7,541,831 B2
(45) Date of Patent: Jun. 2, 2009

(54) SEMICONDUCTOR MEMORY DEVICE FOR ADJUSTING IMPEDANCE OF DATA OUTPUT DRIVER

(75) Inventor: Kyung-Hoon Kim, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/987,937

(22) Filed: Dec. 6, 2007

(65) Prior Publication Data

US 2008/0088338 A1   Apr. 17, 2008

Related U.S. Application Data

(63) Continuation of application No. 11/320,664, filed on Dec. 30, 2005, now Pat. No. 7,323,900.

(30) Foreign Application Priority Data

Sep. 27, 2005   (KR) ............. 10-2005-0090063

(51) Int. Cl.
*H03K 17/16* (2006.01)
(52) U.S. Cl. ............. 326/30; 327/308; 365/189.05
(58) Field of Classification Search ............... 326/30; 327/308, 87; 365/189.05, 198.11, 230.08
See application file for complete search history.

(56) References Cited

U.S. PATENT DOCUMENTS

| | | | |
|---|---|---|---|
| 5,144,165 A | 9/1992 | Dhong et al. | |
| 5,319,258 A | 6/1994 | Ruetz | |
| 6,307,791 B1 * | 10/2001 | Otsuka et al. | 365/189.05 |
| 6,509,778 B2 * | 1/2003 | Braceras et al. | 327/308 |
| 6,556,052 B2 | 4/2003 | Garrett, Jr. et al. | |
| 6,870,419 B1 | 3/2005 | Garrett, Jr. et al. | |
| 2005/0057981 A1 | 3/2005 | Yoo | |
| 2005/0116736 A1 | 6/2005 | Blodgett et al. | |

FOREIGN PATENT DOCUMENTS

| | | |
|---|---|---|
| JP | 9-64720 | 3/1997 |
| KR | 10-2005-0022163 | 3/2005 |
| KR | 10-2005-0072205 | 7/2005 |
| KR | 10-2005-0100290 | 10/2005 |

\* cited by examiner

*Primary Examiner*—Daniel D Chang
(74) *Attorney, Agent, or Firm*—Mannava & Kang P.C.

(57) ABSTRACT

A semiconductor memory device includes a reference signal generating unit for generating a reference signal; a comparing unit for comparing the reference signal with a test signal applied to a test pad to output an adjusted value after adjusting the adjusted value until the test signal is equal to the reference signal; an impedance measuring unit for measuring an impedance of the test pad based on the adjusted value to output the test signal; an impedance adjusting unit for adjusting an impedance of a data I/O pad to have an impedance value corresponding to the adjusted value outputted when the test signal is equal to the reference signal; an impedance control unit for controlling the comparing unit so that the adjusted value is outputted when the test signal is equal to the reference signal; and a reference signal control unit for adjusting a voltage level of the reference signal.

16 Claims, 10 Drawing Sheets

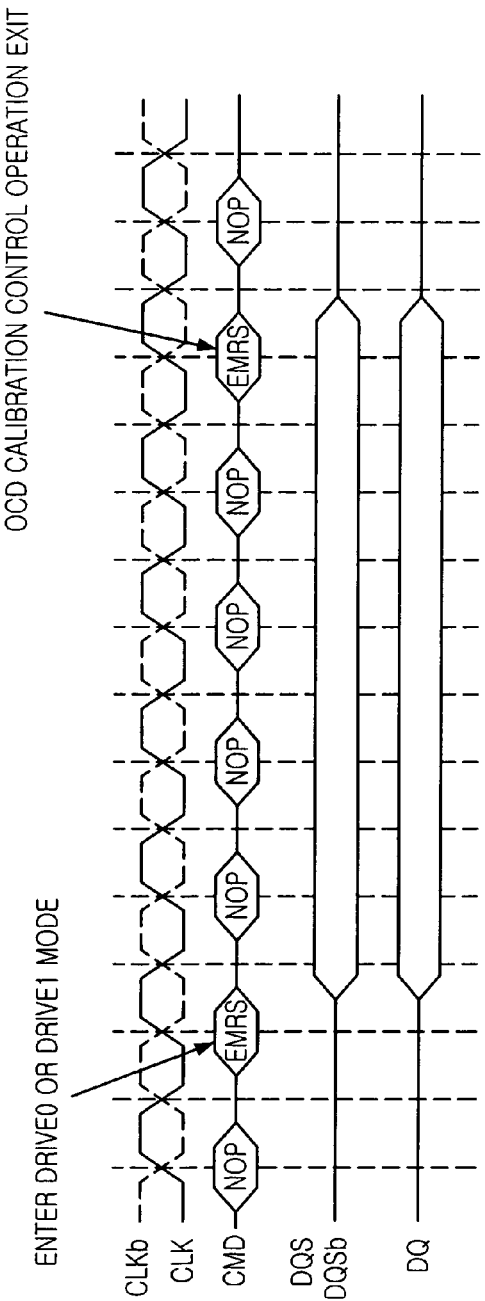

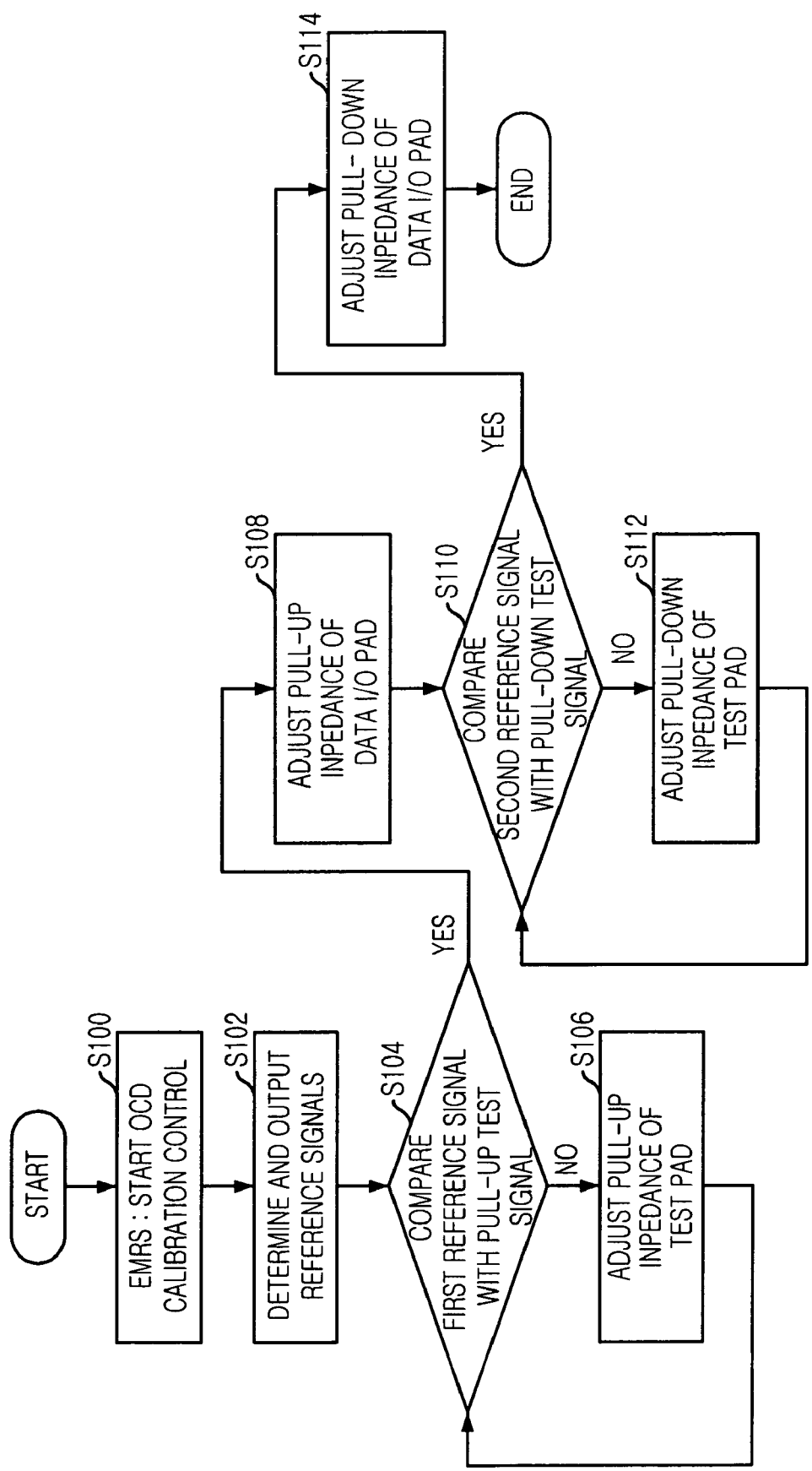

SEMICONDUCTOR MEMORY DEVICE FOR ADJUSTING IMPEDANCE OF DATA OUTPUT DRIVER

RELATED APPLICATIONS

This application is a Continuation of U.S. application Ser. No. 11/320,664, filed Dec. 30, 2005, now U.S. Pat. No. 7,323,900, claiming priority of Korean Application No. 10-2005-0090063, filed Sep. 27, 2005, the entire contents of each of which are hereby incorporated by reference.

FIELD OF THE INVENTION

The present invention relates to a semiconductory memory device; and, more particularly, to a semiconductor memory device for effectively performing an OCD/ODT calibration control operation after fabricating the semiconductor memory device.

DESCRIPTION OF RELATED ARTS

A dynamic random access memory (DRAM) has been improved continuously to increase its operational speed. Synchronizing an internal clock signal with an external clock signal is one of methods to improve the operational speed of the DRAM. The DRAM operating in synchronization with the external clock signal is called a synchronous DRAM (SDRAM).

The SDRAM performs a data access operation in synchronization with a rising edge of the external clock signal. That is, the SDRAM can perform the data access operation once within one cycle of the external clock signal. Such an SDRAM that performs the data access operation once within one cycle of the external clock signal is particularly called a single data rate (SDR) SDRAM.

However, the SDR SDRAM had to be more improved for use in a high speed system. Therefore, a double data rate (DDR) SDRAM has been developed. The DDR SDRAM performs the data access operation in synchronization with a rising edge and a falling edge of the external clock signal. That is, the DDR SDRAM performs the data access operation twice within one cycle of the external clock signal. Hence, even if the frequency of the external clock signal is not increased, the DDR SDRAM has a bandwidth at least twice larger than that of the SDR SDRAM to guarantee a high speed operation.

In the meantime, a double data rate 2 (DDR2) SDRAM is an upgraded version of the DDR SDRAM. For enhancing an operational speed of the DDR2 SDRAM, new concepts have been proposed by an international electronics standardization organization, namely the Joint Electron Device Engineering Council (JEDEC).

An off chip driver (OCD) calibration control is one of the proposed new concepts. The OCD calibration control is performed by optimizing the impedance of a data output driver for a current system. The impedance optimization is accomplished by measuring a current flowing from an external device such as a chipset to the data output driver or a voltage supplied to the data output driver from the chipset. Therefore, for that purpose described above, the DDR2 SDRAM should have the ability of adjusting the impedance of the data output driver.

An on die termination (ODT) is also one of the proposed new concepts. The ODT adjusts the resistance of a data input/output pad when the semiconductor memory device is integrated on a main board, thereby transmitting a data signal without impedance discordance.

FIG. 1 is a block diagram showing a data interface between a chipset and a conventional DDR SDRAM.

The data interface in FIG. 1 shows roughly how data access operation is performed.

As described in FIG. 1, the conventional DDR SDRAM receives a plurality of command signals such as a chip selection bar signal /CS, a write enable bar signal /WE, a clock signal CLK and a clock bar signal /CLK from the chipset through plural command input pins. The conventional DDR SDRAM also receives a plurality of address signals A0 to A15 through plural address input pins. In addition, the conventional DDR SDRAM receives or outputs data DQ0 to DQ15 through a plurality of data input/output (I/O) pins.

The conventional DDR SDRAM receives a data strobe signal DQS and a data strobe bar signal /DQS, i.e., an inverted data strobe signal, through data strobe input pins. The data strobe signal DQS is clocked and inputted to the conventional DDR SDRAM during the timing of data inputted. The conventional DDR SDRAM aligns the inputted data using the data strobe signal DQS and transfers the aligned data to an internal core thereof. Likewise, the conventional DDR SDRAM outputs data by generating an internal data strobe signal that is clocked during the timing of the data outputted.

FIG. 2 is a flow chart showing a sequence of performing an OCD calibration control operation proposed by the JEDEC. Each step in the sequence is marked by step numbers from S10 to S21.

The sequence is roughly divided into two steps, i.e., a first step for measuring an output impedance of a data output driver and a second step for adjusting the output impedance to the status of a current system.

The data output driver including a pull-up driver and a pull-down driver activates one of those drivers to output a data. That is, the data output driver outputs the data as a logic level 'HIGH' through the pull-up driver and the data as a logic level 'LOW' through the pull-down driver. Therefore, the output impedance of the data output driver should be measured by measuring an output impedance of the pull-up driver or that of the pull-down driver. In a first drive mode DRIVE1, the output impedance of the pull-up driver is measured, and, in a second drive mode DRIVE0, the output impedance of the pull-down driver is measured.

The sequence of performing the OCD calibration control operation is described in FIG. 2.

First, when an extended mode register set (EMRS) of the DDR SDRAM enters into the OCD calibration control operation, the EMRS sets a drive mode to the first drive mode DRIVE1. Then, all of the output data DQ0 to DQ15 and the data strobe signal DQS become a logic level 'HIGH', and the data strobe bar signal /DQS becomes a logic level 'LOW' as shown in step S10.

Herein, in the first drive mode DRIVE1, the output impedance of the data output driver is measured when the pull-up driver outputs the data as a logic level 'HIGH'. The EMRS means a mode for outputting values which are set to internal registers to define various operations of the conventional DDR SDRAM.

Thereafter, the chipset measures the output impedance of the pull-up driver. If it is determined in step S11 that the measured output impedance is not the optimized value for the current system, the EMRS enters into an adjustment mode for adjusting the output impedance of the pull-up driver in step S12.

In the adjustment mode, the output impedance of the pull-up driver is increased or decreased by decoding a burst code inputted through the data I/O pins to thereby adjust the output impedance of the pull-up driver in step S13. Herein, a burst length (BL) of the burst code is set to 4 bits and the chipset outputs the burst code and measures the output impedance.

The output impedance of the pull-up driver is adjusted by varying the number of turned-on pull-up MOS transistors among whole pull-up MOS transistors which are connected in parallel and included in the pull-up driver.

Continuously, the EMRS exits from the OCD calibration control mode in step S14 and then the EMRS sets the drive mode to the first drive mode DRIVE1 for measuring the output impedance of the pull-up driver again in the step 10. If it is determined again that the output impedance of the pull-up driver is not the optimized value, the output impedance of the pull-up driver is adjusted again to have the optimized value by the same way described in the step S13.

In the step S11, if the measured output impedance is determined to have the optimized value, the EMRS exits from the OCD calibration control mode in step S15 and then the EMRS sets the drive mode to the second drive mode DRIVE0 in step S16.

In the second drive mode DRIVE0, the output impedance of the data output driver is measured when the pull-down driver outputs the data as a logic level 'LOW'.

Thereafter, the chipset measures the output impedance of the pull-down driver. In step S17, if the measured output impedance is determined to have the optimized value, the EMRS exits from the OCD calibration control operation in step S21.

On the other hand, if the measured output impedance is decided not to have the optimized value, the EMRS enters into the adjustment mode for adjusting the output impedance of the pull-down driver in step S18. Then, steps S19, S20, S16 and S17 are performed repeatedly until the measured output impedance of the pull-down driver becomes the optimized value. Finally, if the measured output impedance becomes the optimized value, the EMRS exits from the OCD calibration control operation in the step S21.

In FIGS. 3A and 3B, there is described in detail the operation of measuring the output impedance of the data output driver.

FIG. 3A is a timing diagram showing the operation of measuring the output impedance of the data output driver while the OCD calibration control operation is performed.

FIG. 3B is a table describing operational modes according to a 3-bit control signal in the operation of measuring the output impedance of the data output driver shown in FIG. 3A, wherein the 3-bit control signal is inputted through address pins A7, A8 and A9.

To begin with, the chipset inputs the 3-bit control signal to the conventional DDR SDRAM so as to control an output mode of the EMRS to be the first drive mode DRIVE1 or the second driver mode DRIVE0.

Herein, the 3-bit control signal is inputted through the address pins A7 to A9 as above mentioned. A status of the OCD calibration control operation according to the 3-bit control signal is shown in the table of FIG. 3B.

For example, if the 3-bit control signal is inputted as '001', the output mode of the EMRS becomes the first driver mode DRIVEL; if '010', the second drive mode DRIVE0; and if '100', the adjustment mode. On the other hand, if the 3-bit control signal is inputted as '111', the output impedance of the data output driver keeps a default impedance value.

In the first drive mode DRIVE1, the data output driver in the DDR SDRAM outputs the data as a logic level 'HIGH' and thus the output impedance of the pull-up driver is measured.

In the second drive mode DRIVE0, the data output driver in the DDR SDRAM outputs the data as a logic level 'LOW' and thus the output impedance of the pull-down driver is measured.

The operation of adjusting the output impedance of the data output driver is described in detail referring to FIGS. 4A and 4B.

FIG. 4A is a timing diagram showing the operation of adjusting the output impedance of the data output driver while the OCD calibration control mode is performed and FIG. 4B provides a table showing the OCD calibration control operation according to the burst code.

Hereinafter, with reference to FIGS. 4A and 4B, the operation of adjusting the output impedance of the data output driver is explained in detail.

After the EMRS enters into the adjustment mode, the chipset inputs burst codes having 4 bits DT0 to DT3 (hereinafter, referred to as 4-bit burst codes) to the conventional DDR SDRAM through the data I/O pins.

The table shown in FIG. 4B describes the operation of the adjustment mode according to the 4-bit burst codes DT0 to DT3.

The operation in the adjustment mode is performed by selectively turning on or off MOS transistors included in the data output driver.

For example, if the 4-bit burst codes DT0 to DT3 are inputted as '1000', the number of turned-on MOS transistors in the pull-down driver is decreased by one. If the 4-bit burst codes DT0 to DT3 are inputted as '1001', the number of turned-on MOS transistors in the pull-up driver is increased by one and the number of turned-on MOS transistors in the pull-down driver is decreased by one.

After adjusting the number of turned-on MOS transistors in the pull-up or the pull-down driver based on the 4-bit burst codes, the OCD calibration control operation is finished.

In the mean time, in the conventional DDR SDRAM, a device for controlling the output impedance of the data output driver is not required. However, recently, it becomes possible to control the output impedance of the data output driver by dividing the output impedance into plural unit steps. Accordingly, a device for controlling the output impedance of the data output driver is required.

Hereinbefore, there has been illustrated the OCD according to the DDR2 specification.

Meanwhile, in a double data rate 3 (DDR3) SDRAM, which is an upgraded version of the DDR2 SDRAM, the device for controlling the output impedance of the data output driver includes a test pad (hereinafter, referred to as a ZQ PAD) for measuring the impedance of the data output driver so as to optimize the impedance of a data input/output pad (hereinafter, referred to as a DQ PAD) by detecting a voltage level at the ZQ PAD.

The operation of performing the OCD calibration control using the device for controlling the output impedance of the data output driver is described in FIG. 5.

FIG. 5 is a block diagram depicting the device for performing the OCD calibration control in the conventional DDR SDRAM, especially, the DDR3 SDRAM.

As shown in FIG. 5, the device for performing the OCD calibration control includes a ZQ PAD 10, a pull-up driving unit, a pull-down driving unit, a reference signal generating unit 20, an OCD control unit 30, an EMRS control unit 40 and a DQ PAD 50.

The pull-up driving unit includes a first and a second pull-up impedance measuring unit 12 and 14, a first and a second pull-up impedance adjusting unit 42 and 44, a first comparator 22 and a first code converter 26.

An operation for determining a pull-up impedance of the pull-up driving unit is described as follows.

First, the first pull-up impedance measuring unit 12 including a plurality of PMOS transistors connected in parallel makes a predetermined number of PMOS transistors among the PMOS transistors be turned on.

The reference signal generating unit 20 outputs a first reference signal Vref1 having a voltage level of half of a source voltage VDD and the first comparator 22 compares a pull-up test signal Vzq1 coupled from the ZQ PAD 10 with the first reference signal Vref1 under the control of the OCD control unit 30.

The first code converter 26 decodes the comparison result of the first comparator 22 to output a decoded comparison value to the first pull-up impedance measuring unit 12, the second pull-up impedance measuring unit 14 and the first pull-up impedance adjusting unit 42.

In case that the first reference signal Vref1 is higher than the pull-up test signal Vzq1, the first pull-up impedance measuring unit 12 increases the number of turned-on PMOS transistors therein so as to decrease the pull-up impedance coupled to the ZQ PAD 10.

In case that the first reference signal Vref1 is lower than the pull-up test signal Vzq1, the first pull-up impedance measuring unit 12 decreases the number of turned-on transistors therein so as to increase the pull-up impedance coupled to the ZQ PAD 10.

As described above, it is possible to control the pull-up impedance coupled to the ZQ PAD to according to the voltage level of the first reference signal Vref1.

In case that the first reference signal Vref1 is equal to the pull-up test signal Vzq1, the first pull-up impedance adjusting unit 42 determines the pull-up impedance coupled to the DQ PAD 50 based on the decoded value outputted from the first code converter 26. Namely, the first pull-up impedance adjusting unit 42 including a plurality of PMOS transistors connected in parallel adjusts the number of turned-on PMOS transistors therein according to the decoded value of the first code converter 26. In this way, the pull-up impedance of the pull-up driving unit is determined when the DQ PAD 50 is pulled up.

In the same way, a pull-down impedance of the pull-down driving unit is adjusted based on the adjusted pull-up impedance of the pull-up driving unit.

The pull-down driving unit includes a pull-down impedance measuring unit 16, a first and a second pull-down impedance adjusting unit 46 and 48, a second comparator 24 and a second code converter 28.

An operation for determining the pull-down impedance of the pull-down driving unit is described as follows.

First, the second pull-up impedance measuring unit 14 including a plurality of NMOS transistors connected in parallel adjusts the number of turned-on NMOS transistors therein, wherein the number of turned-on NMOS transistor at the second pull-up impedance measuring unit 14 is identical to the number of turned-on PMOS transistors at the first pull-up impedance measuring unit 12.

The reference signal generating unit 20 outputs a second reference signal Vref2 having a voltage level of half of the source voltage VDD. The second comparator 24 compares a pull-down test signal Vzq2 inputted from the second pull-up impedance measuring unit 14 with the second reference signal Vref2 under the control of the OCD control unit 30.

The second code converter 28 decodes the comparison result of the second comparator 24 to output a decoded value to the pull-down impedance measuring unit 16 and the second pull-down impedance adjusting unit 46.

In case that the second reference signal Vref2 is higher than the pull-down test signal Vzq2, the pull-down impedance measuring unit 16 increases the number of turned-on NMOS transistors so as to decrease the pull down impedance coupled to the ZQ PAD 10.

In case that the second reference signal Vref2 is lower than the pull-down test signal Vzq2, the pull-down impedance measuring unit 16 decreases the number of turned-on NMOS transistors so as to increase the pull-down impedance coupled to the ZQ PAD 10.

In case that the second reference signal Vref2 is equal to the pull-down test signal Vzq2, the second pull-down impedance adjusting unit 46 determines the pull-down impedance of the DQ PAD 50 based on the decoded value of the second code converter 28. Namely, the first pull-down impedance adjusting unit 46 including a plurality of NMOS transistors connected in parallel adjusts the number of turned-on NMOS transistors therein based on the decoded value of the second code converter 28. In this way, the pull-down impedance of the pull-down driving unit is determined when the DQ PAD 50 is pulled down.

As described above, the fabrication of the semiconductor memory device is finished after the OCD calibration control operation is performed. However, sometimes, the pull-up or the pull-down impedance applied to the DQ PAD 50 may be variable because of several problems occurred in the fabricated semiconductor memory device.

Also, when the semiconductor memory device is applied to a specific system, the pull-up or the pull-down impedance applied to the DQ PAD 50 needs to be changed. In this time, it is possible to change the pull-up impedance applied to the DQ PAD 50 by adjusting the number of the pull-up PMOS transistors connected in parallel at the second pull-up impedance adjusting unit 44 based on a control signal outputted from the EMRS control unit 40. Also, it is possible to change the pull-down impedance applied to the DQ PAD 50 by adjusting the number of the pull-down NMOS transistors connected in parallel at the first pull-down impedance adjusting unit 48 based on the control signal outputted from the EMRS control unit 40.

However, in this case, the conventional DDR SDRAM adjusts the pull-down impedance after adjusting the pull-up impedance. Therefore, it is impossible to control an exact impedance value. Moreover, the pull-up or the pull-down impedance applied to the DQ PAD cannot be reduced.

SUMMARY OF INVENTION

It is, therefore, an object of the present invention to provide a semiconductor memory device for effectively performing an OCD/ODT calibration control operation after fabricating the semiconductor memory device.

In accordance with an aspect of the present invention, there is provided a semiconductor memory device for adjusting an output impedance of a data output driver, including: a reference signal generating unit for generating a reference signal; a comparing unit for comparing the reference signal with a test signal applied to a test pad to thereby output an adjusted value to the test pad after adjusting the adjusted value until the test signal is equal to the reference signal; an impedance measuring unit for measuring an impedance of the test pad based on the adjusted value to output the test signal to the comparing unit; an impedance adjusting unit for adjusting an impedance of a data input/output pad so as to have an impedance value corresponding to the adjusted value outputted when the test signal is equal to the reference signal; an impedance control unit for controlling the comparing unit so that the adjusted value is outputted when the test signal is equal to the reference signal; and a reference signal control unit for controlling the reference signal generating unit to adjust a voltage level of the reference signal.

In accordance with another aspect of the present invention, there is provided a device for adjusting an output impedance of a data output driver, including: a data input/output pad and a test pad; a reference signal generating unit for generating a first reference signal and a second reference signal; a first comparing unit for comparing the first reference signal with a first test signal applied to the test pad to thereby output a first adjusted value to the test pad after adjusting the first adjusted value until the first test signal is equal to the first reference signal; a second comparing unit for comparing the second reference signal with a second test signal applied to the test pad to thereby output a second adjusted value to the test pad after adjusting the second adjusted value until the second test signal is equal to the second reference signal; a first pull-up impedance measuring unit for adjusting a pull-up impedance of the test pad based on the first adjusted value; a second pull-up impedance measuring unit for supplying the second test signal for the second comparing unit based on the first adjusted value outputted when the first reference signal is equal to the first test signal; a pull-down impedance measuring unit for adjusting a pull-down impedance of the test pad based on the second adjusted value; a pull-up impedance adjusting unit for adjusting a pull-up impedance of the data input/output pad in response to the first adjusted value outputted when the first reference signal is equal to the first test signal; a pull-down impedance adjusting unit for adjusting a pull-down impedance of the data input/output pad in response to the second adjusted value outputted when the second reference signal is equal to the second test signal; an impedance control unit for controlling the first and the second comparing units; and a reference signal control unit for controlling the reference signal generating unit to adjust voltage levels of the first and the second reference signals.

In accordance with further another aspect of the present invention, there is provided a method for adjusting an output impedance of a data output driver, including: determining voltage levels of a first reference signal and a second reference signal; comparing the first reference signal with a first test signal applied to a test pad; adjusting a pull-up impedance of a first measuring unit based on a first comparison result; determining a pull-up impedance of a data input/output pad based on the first comparison result outputted when the first test signal is equal to the first reference signal; setting a pull-up impedance of a second measuring unit based on the first comparison result when the first test signal is equal to the first reference signal; comparing the second reference signal with a second test signal applied to the second measuring unit; determining a pull-down impedance of a third measuring unit based on a second comparison result; and determining a pull-down impedance of the data input/output pad based on the second comparison result outputted when the second test signal is equal to the second reference signal.

BRIEF DESCRIPTION OF THE DRAWINGS

The above and other objects and features of the present invention will become apparent from the following description of preferred embodiments taken in conjunction with the accompanying drawings, in which:

FIG. 3A is a timing diagram showing an operation of measuring an output impedance of a data output driver;

FIG. 3B is an operation table showing an operation of performing the OCD calibration control mode in response to a 3-bit control signal;

FIG. 11 is a flow chart showing an operational sequence of performing the OCD calibration control in the semiconductor memory device shown in FIGS. 6 to 10.

DETAILED DESCRIPTION OF INVENTION

Hereinafter, a synchronous semiconductor memory device in accordance with the present invention will be described in detail referring to the accompanying drawings.

Figure 6:
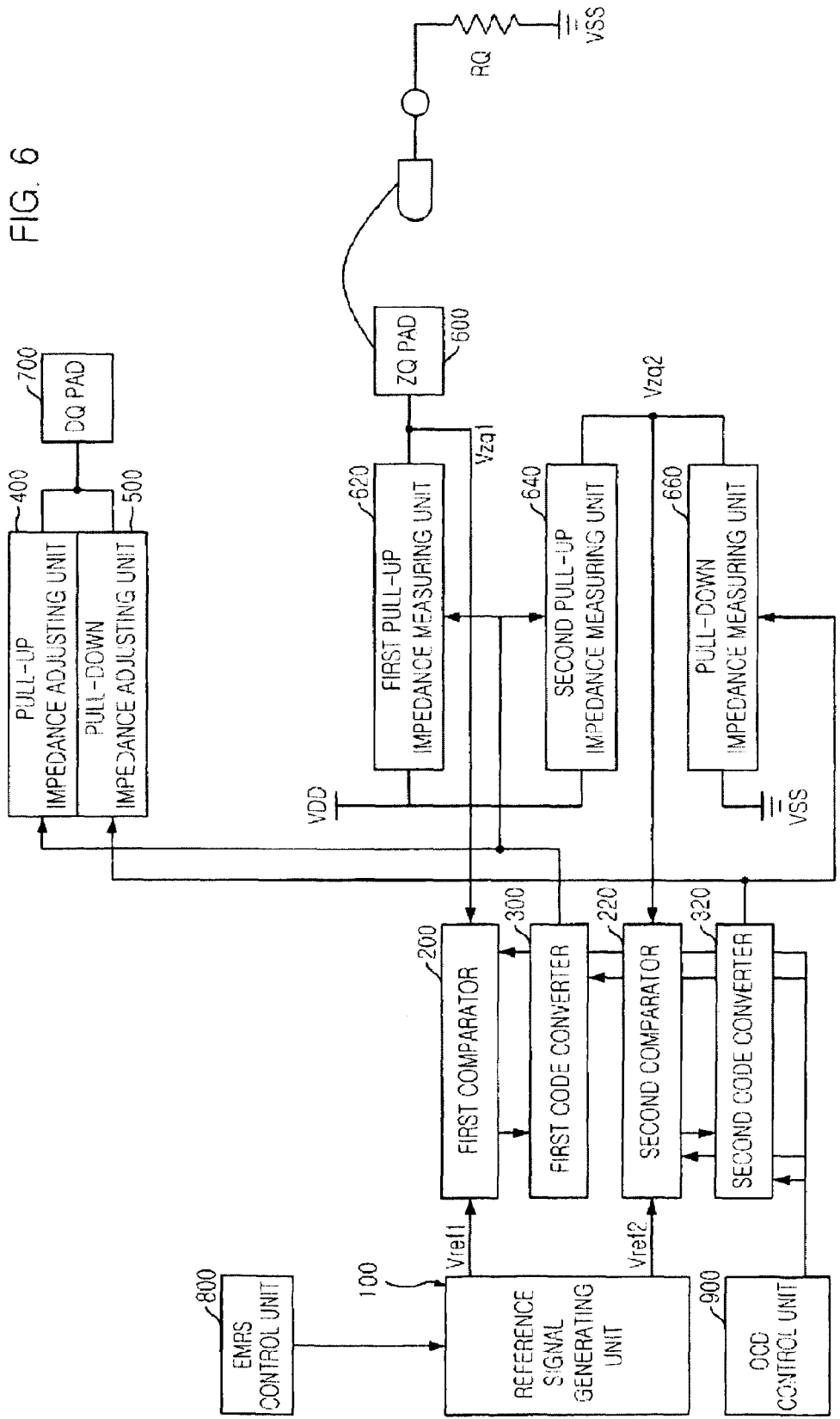
FIG. 6 is a block diagram showing a device for performing the OCD calibration control of a semiconductor memory device in accordance with an embodiment of the present invention.

FIG. 6 is a block diagram showing a device for performing the OCD calibration control of a semiconductor memory device in accordance with an embodiment of the present invention.

As shown, the device for performing the OCD calibration control in accordance with the embodiment of the present invention includes a reference signal generating unit 100, a first comparing unit, a second comparing unit, a pull-up impedance adjusting unit 400, a pull-down impedance adjusting unit 500, a test pad (hereinafter, referring to a ZQ PAD) 600, a first pull-up impedance measuring unit 620, a second pull-up impedance measuring unit 640, a pull-down impedance measuring unit 660, a data input/output (I/O) pad (hereinafter, referring to a DQ PAD) 700, a reference signal control unit 800 and an impedance control unit 900.

The reference signal generating unit 100 generates a first reference signal Vref1 and a second reference signal Vref2.

The first comparing unit compares the first reference signal Vref1 with a pull-up test signal Vzq1 applied to the ZQ PAD 600 to output a first adjusted value to the ZQ PAD 600 by adjusting the first adjusted value until the pull-up test signal Vzq1 is equal to the first reference signal Vref1. The second comparing unit compares the second reference signal Vref2 with a pull-down test signal Vzq2 applied to the ZQ PAD 600 to output a second adjusted value to the ZQ PAD by adjusting the second adjusted value until the pull-down test signal Vzq2 is equal to the second reference signal Vref2.

The first pull-up impedance measuring unit 620 adjusts a pull-up impedance of the ZQ PAD based on the first adjusted value. The second pull-up impedance measuring unit 640 supplies the pull-down test signal Vzq2 for the second comparing unit based on the first adjusted value when the first reference signal Vref1 is equal to the pull-up test signal Vzq1. The pull-down impedance measuring unit 660 adjusts a pull-down impedance of the ZQ PAD 600 based on the second adjusted value.

The pull-up impedance adjusting unit 400 adjusts a pull-up impedance of the DQ PAD 700 in response to the first adjusted value outputted when the first reference signal Vref1 is equal to the pull-up test signal Vzq1. The pull-down impedance adjusting unit 500 adjusts a pull-down impedance of the DQ PAD 700 in response to the second adjusted value outputted when the second reference signal Vref2 is equal to the pull-down test signal Vzq2.

The reference signal control unit 800 controls the reference signal generating unit 100 to adjust a voltage level of the first reference signal Vref1 and the second reference signal Vref2. The impedance control unit 900 controls the first and the second comparing unit so that in case that the pull-up test signal Vzq1 is equal to the first reference signal Vref1, the first adjusted value is outputted; and in case that the pull-down test signal Vzq2 is equal to the second reference signal Vref2, the second adjusted value is outputted. Herein, an extended mode register set (EMRS) control unit is used as the reference signal control unit 800 and an OCD control unit is used as the impedance control unit 900.

The first comparing unit includes a first comparator 200 and a first code converter 300. The first comparator 200 compares the first reference signal Vref1 with the pull-up test signal Vzq1. The first code converter 300 decodes the comparison result of the first comparator 200 to supply plural pull-up decoding signals as the first adjusted value.

The second comparing unit includes a second comparator 220 and a second code converter 320. The second comparator 220 compares the second reference signal Vref2 with the pull-down test signal Vzq2. The second code converter 320 decodes the comparison result of the second comparator 220 to supply plural pull-down decoding signals as the second adjusted value.

Figure 7:
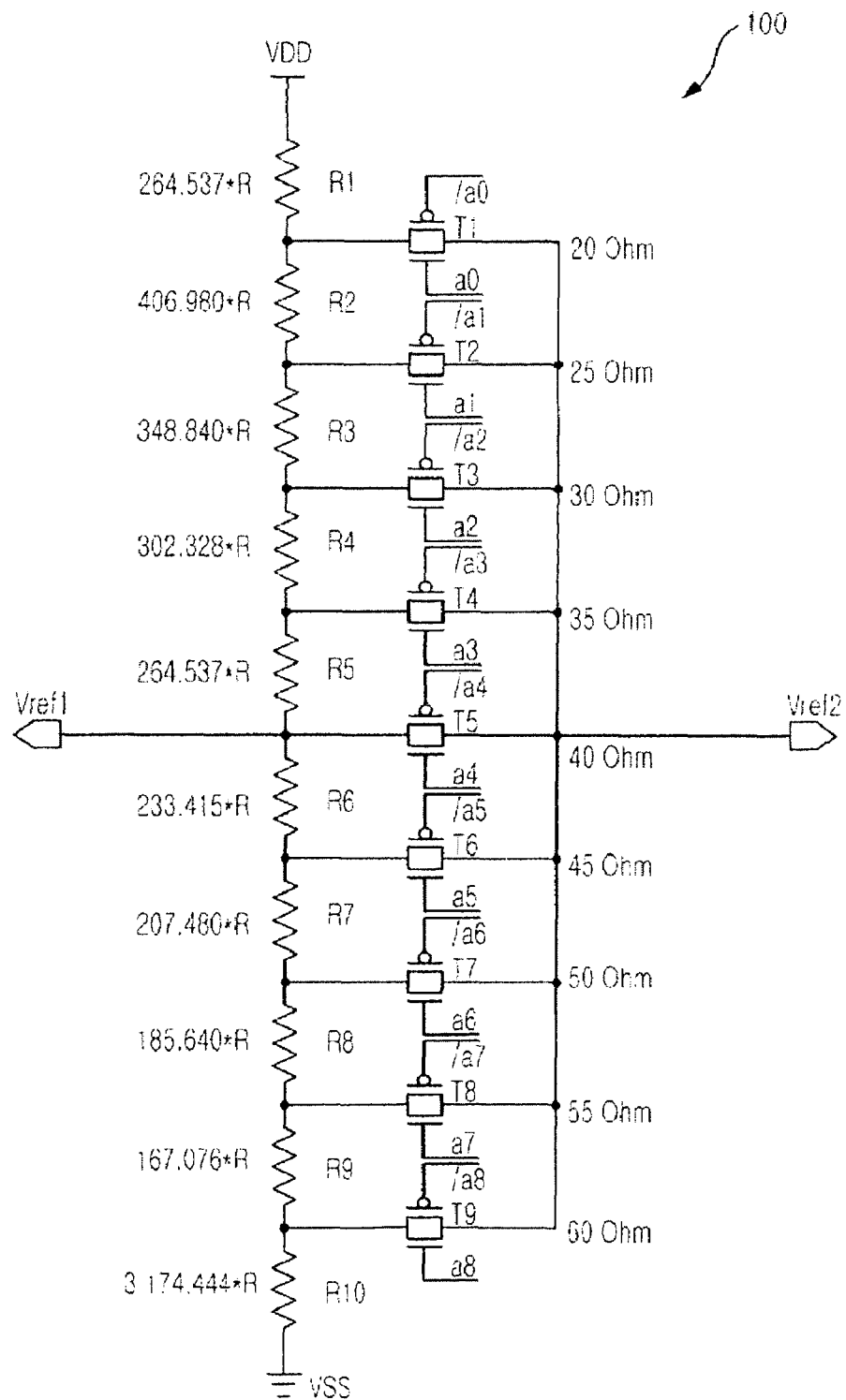
FIG. 7 is a block diagram showing a reference signal generating unit shown in FIG. 6 in detail.

FIG. 7 is a block diagram showing the reference signal generating unit 100 shown in FIG. 6 in detail.

As shown, the reference signal generating unit 100 includes a plurality of resistors R1 to R10, a plurality of transfer gates T1 to T9, and an output unit.

The resistors R1 to R10 are connected in series between a source voltage VDD and a ground voltage VSS. The transfer gates T1 to T9 transfer plural voltages divided by the resistors R1 to R10. Each of The transfer gates T1 to T9 is selectively turned-on by the reference signal control unit 800.

The output unit sets an output of a predetermined transfer gate turned-on by the reference signal control unit 800 to the voltage level of the first reference signal Vref1. Herein, one of the plural voltages divided by the resistors R1 to R10, having a level of the source voltage VDD divided by 2, is set to the voltage level of the second reference signal Vref2.

Figure 8:
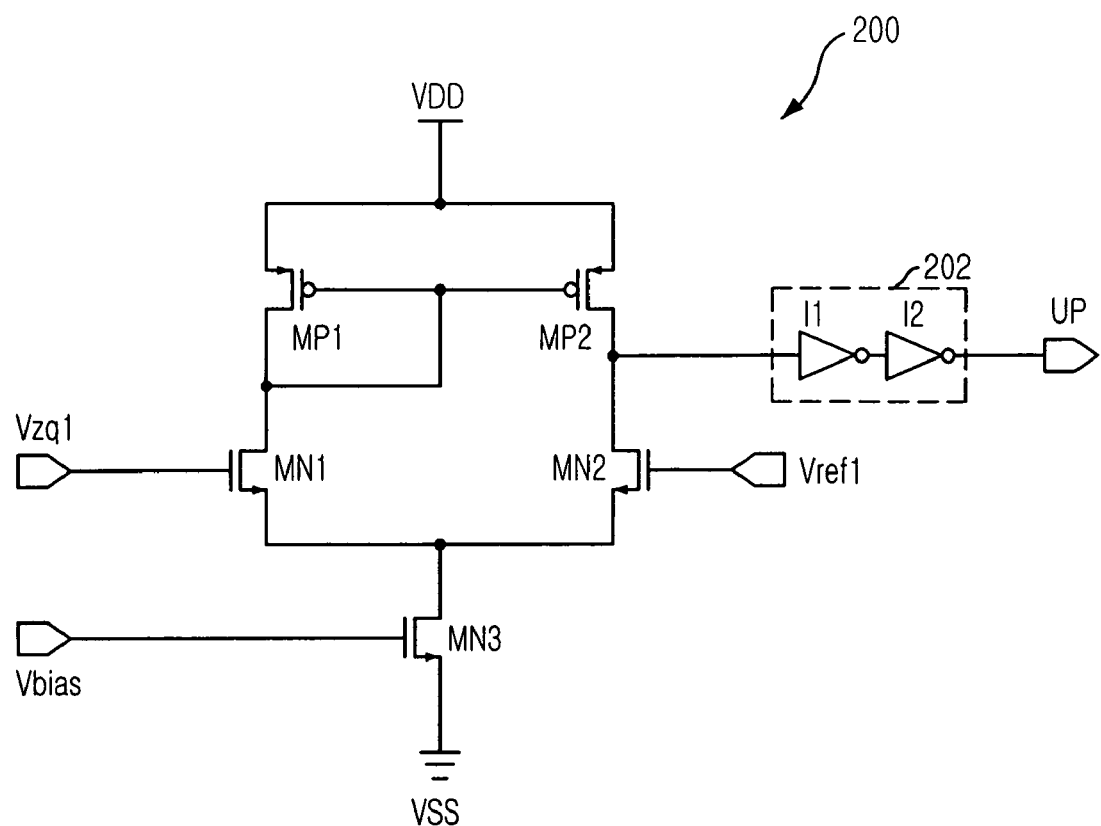
FIG. 8 is a block diagram showing a first comparator shown in FIG. 6 in detail.

FIG. 8 is a block diagram showing the first comparator 200 shown in FIG. 6 in detail.

As shown, the first comparator 200 includes a first PMOS transistor MP1, a second PMOS transistor MP2, a first NMOS transistor MN1, a second NMOS transistor MN2, a third NMOS transistor MN3, and a buffer 202.

The first PMOS transistor MP1 has a source connected to the source voltage VDD and a drain connected to its gate to form a diode type. The second PMOS transistor MP2 has a gate connected to the gate of the first PMOS transistor MP1 and a source connected to the source voltage VDD to form a current mirror with the first PMOS transistor MP1. The first NMOS transistor MN1 has a gate for receiving the pull-up test signal Vzq1 and the drain connected to a drain of the first PMOS transistor MP1. The second NMOS transistor MN2 has a gate for receiving the first reference signal Vref1 and a drain connected to a drain of the second PMOS transistor MP2. The third NMOS transistor MN3 has a gate for receiving a bias voltage Vbias, a drain connected to sources of the first NMOS transistor MN1 and the second NMOS transistor MN2, and a source connected to the ground voltage VSS to thereby form a current source. The buffer 202 buffers a signal applied to the drain of the second NMOS transistor MN2 to output a buffering result as a first comparison value UP.

Meanwhile, the second comparator 220 can be implemented with the same structure as that of the first comparator 200 except that the first NMOS transistor MN1 has a gate for receiving the pull-down test signal Vzq2 and the second NMOS transistor MN2 has a gate for receiving the second reference signal Vref2 so that the buffer 202 outputs a buffering result as a second comparison value DOWN.

Figure 9:
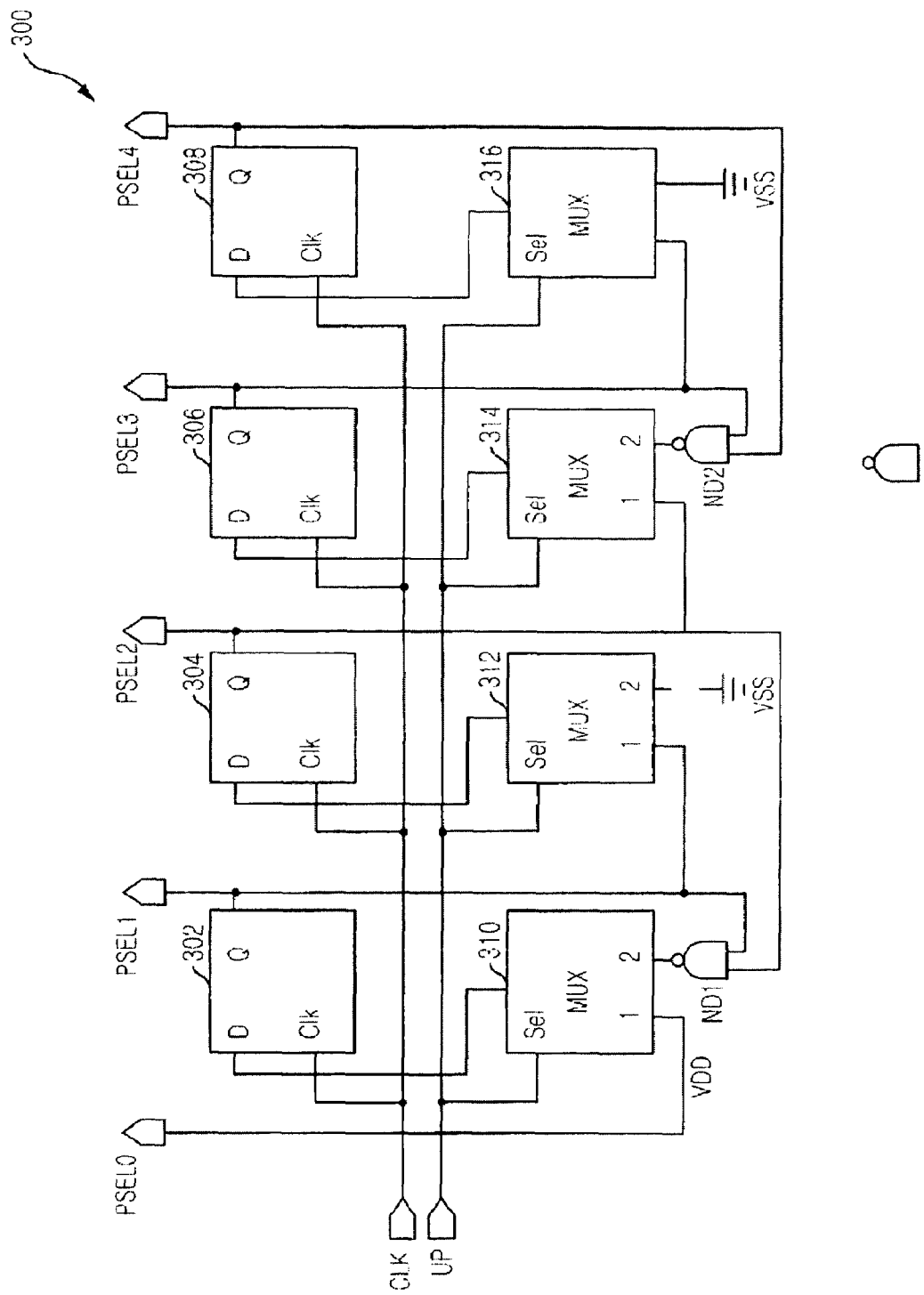
FIG. 9 is a block diagram showing a first code converter shown in FIG. 6 in detail.

FIG. 9 is a block diagram showing the first code converter 300 shown in FIG. 6 in detail.

As shown, the first code converter 300 include a plurality of D-type flip-flops 302 to 308, a plurality of multiplexers 310 to 316, a first NAND gate ND1 and a second NAND gate ND2.

The first code converter 300 outputs plural pull-up decoding signals PSEL0 to PSEL4 in synchronization with the a clock signal CLK, in response to the first comparison value UP outputted from the first comparator 200.

Likewise, the second code converter 320 can be implemented with the same structure as that of the first code converter 300. Accordingly, the second code converter 320 outputs plural pull-down decoding signals NSEL0 to NSEL4 in synchronization with the clock signal CLK, in response to the second comparison value DOWN outputted from the second comparator 220.

Figure 10:
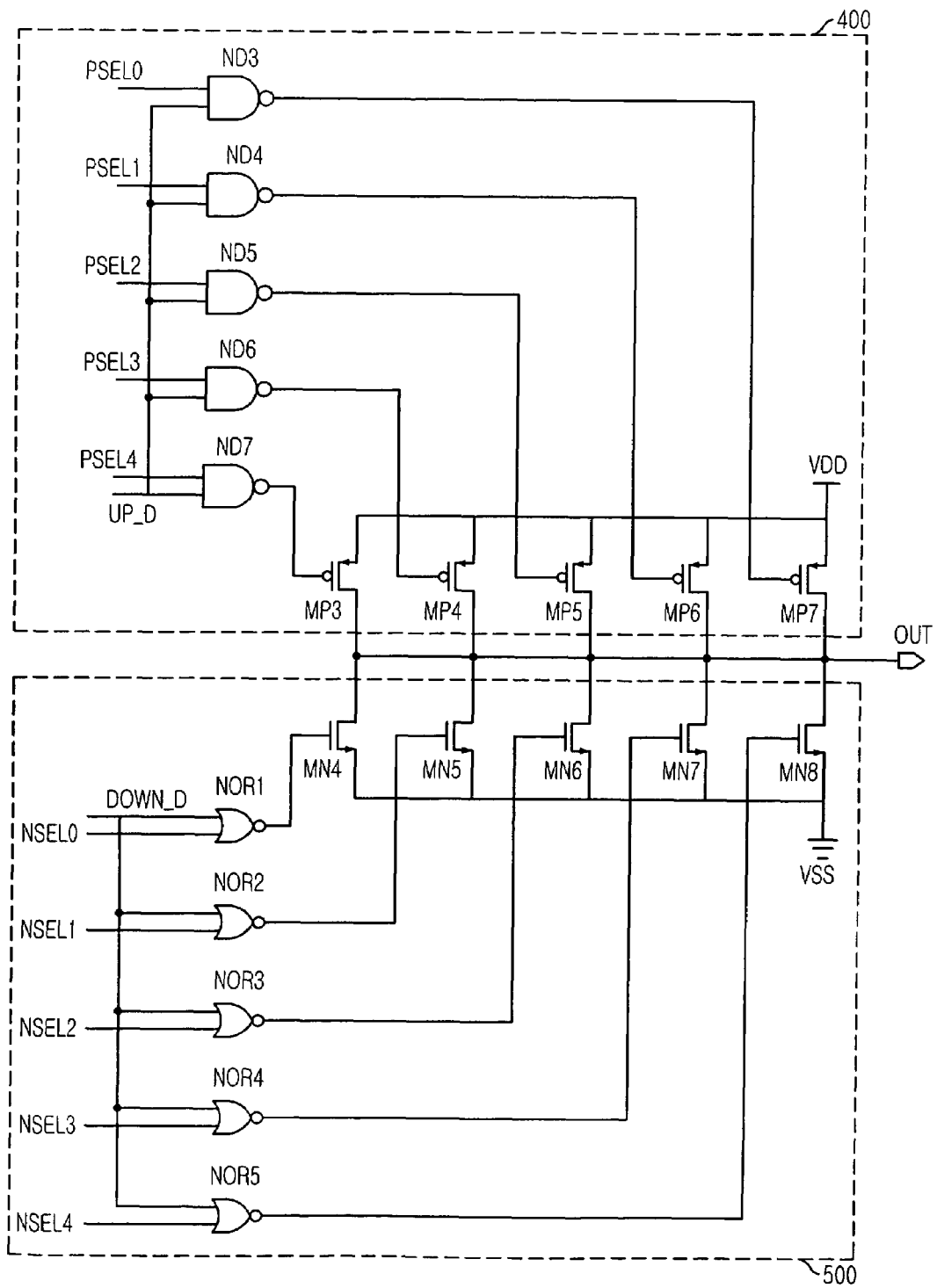
FIG. 10 is a block diagram showing a pull-up impedance adjusting unit and a pull-down impedance adjusting unit shown in FIG. 6 in detail.

FIG. 10 is a block diagram showing the pull-up impedance adjusting unit 400 and the pull-down impedance adjusting unit 500 shown in FIG. 6 in detail.

As shown, the pull-up impedance adjusting unit 400 includes a plurality of NAND gates ND3 to ND7, and a plurality of pull-up PMOS transistors MP3 to MP7. Herein, each of the NAND gates ND3 to ND7 corresponds to each of the pull-up PMOS transistors MP3 to MP7.

The NAND gates ND3 to ND7 receive the pull-up decoding signals PSEL0 to PSEL4 and a pull-up control signal UP_D outputted from an inside of the semiconductor memory device. The pull-up PMOS transistors MP3 to MP7 connect the DQ PAD 700 to the source voltage VDD based on outputs of NAND gates ND3 to ND7.

Referring to FIG. 10, the pull-down impedance adjusting unit 500 includes a plurality of NOR gates NOR1 to NOR5, and a plurality of pull-down NMOS transistors MN4 to MN8. Herein, each of the NOR gates NOR1 to NOR5 corresponds to each of the pull-down NMOS transistors MN4 to MN8.

The NOR gates NOR1 to NOR5 receive the pull-down decoding signals NSEL0 to NSEL4 and a pull-down control signal DOWN_D outputted from the inside of the semiconductor memory device. The pull-down NMOS transistors MN4 to MN8 connect the DQ PAD 700 to the ground voltage based on outputs of NOR gates NOR1 to NOR5.

FIG. 11 is a flow chart showing an operational sequence of performing the OCD calibration control in the semiconductor memory device shown in FIGS. 6 to 10.

Hereinafter, referring to FIGS. 6 to 10, the operational sequence of performing the OCD calibration control in the semiconductor memory device is described as follows. Each step for the operational sequences is marked by step numbers from S100 to S114.

First, when the EMRS of the semiconductor memory device enters into the OCD calibration control operation as shown in the step S100, the EMRS control unit used as the reference signal control unit 800 sets the voltage level of the first reference signal Vref1 and the second reference signal Vref2. Herein, the first reference signal Vref1 can be variable and the second reference signal Vref2 can have the voltage level of the source voltage VDD divided by 2.

The reference signal generating unit 100 outputs one of the plural voltages divided by the resistors R1 to R10 in series as the first reference signal Vref1 through the transfer gates T1 to T9 to the first comparator 200 as shown in the step S102.

The first reference signal Vref1 can be adjusted from a 20 ohm to a 60 ohm by a 5 ohm unit on the basis of a 40 ohm. It can be differently set by a specification of the semiconductor memory device.

In the mean time, the first pull-up impedance measuring unit 620 including plural PMOS transistors in parallel turns on a predetermined number of the PMOS transistors.

The first comparator 200 compares the first reference signal Vref1 with the pull-up test signal Vzq1 applied to the ZQ PAD 600 to output the first comparison value UP, controlled by the OCD control unit used as the impedance control unit 900 as shown in the step S104.

The first code converter 300 outputs the pull-up decoding signals PSEL0 to PSEL4 to the pull-up impedance adjusting unit 400 and the first pull-up impedance measuring unit 620, based on the first comparison value UP.

In case that the first reference signal Vref1 is higher than the pull-up test signal Vzq1, the first pull-up impedance measuring unit 620 having plural PMOS transistors in parallel increases the number of turned-on PMOS transistors so that the pull-up impedance of the ZQ PAD 600 can be decreased. In case that the first reference signal Vref1 is lower than the pull-up test signal Vzq1, the first pull-up impedance measuring unit 620 decreases the number of turned-on PMOS transistors so that the pull-up impedance of the ZQ PAD 600 can be increased.

Accordingly, it is possible to adjust the pull-up impedance of the ZQ PAD 600 based on the voltage level of the first reference signal Vref1 as shown in the step S106.

Then, the steps S106 and S104 are performed continuously until the pull-up test signal Vzq1 is equal to the first reference signal Vref1. Finally, in case that the pull-up test signal Vzq1 is equal to the first reference signal Vref1, the pull-up impedance adjusting unit 400 having plural pull-up PMOS transistors in parallel adjusts the number of turned-on pull-up PMOS transistors based on the pull-up decoding signals PSEL0 to PSEL4 and the pull-up control signal UP_D outputted from the inside of the semiconductor memory device. As a result, the pull-up impedance of the DQ PAD 700 can be determined as shown in the step S108.

Then, to determine the pull-down impedance of the DQ PAD 700, the second pull-up impedance measuring unit 640 having plural PMOS transistors in parallel sets the number of turned-on PMOS transistors to output the pull-down test signal Vzq2, based on the number of turned-on PMOS transistors when the pull-up test signal Vzq1 is equal to the first reference signal Vref1.

The second comparator 220 compares the second reference signal Vref2, having the voltage level of the source voltage VDD divided by 2, with the pull-down test signal Vzq2 applied to the ZQ PAD 600 to output the second comparison value DOWN, controlled by the OCD control unit used as the impedance control unit 900 as shown in the step S110.

The second code converter 320 outputs the pull-down decoding signals NSEL0 to NSEL4 to the pull-down impedance adjusting unit 500 and the pull-down impedance measuring unit 660, based on the second comparison value DOWN.

In case that the second reference signal Vref2 is higher than the pull-down test signal Vzq2, the pull-down impedance measuring unit 660 having plural NMOS transistors in parallel increases the number of turned-on NMOS transistors so that the pull-down impedance of the ZQ PAD 600 can be decreased. In case that the second reference signal Vref2 is lower than the pull-down test signal Vzq2, the pull-down impedance measuring unit 660 decreases the number of turned-on NMOS transistors so that the pull-down impedance of the ZQ PAD 600 can be increased.

Accordingly, it is possible to adjust the pull-down impedance of the ZQ PAD 600 based on the voltage level of the second reference signal Vref2 as shown in the step S112.

Likewise, the steps S112 and S110 are performed continuously until the pull-down test signal Vzq2 is equal to the second reference signal Vref2. Finally, in case that the pull-down test signal Vzq2 is equal to the second reference signal Vref2, the pull-down impedance adjusting unit 500 having plural NMOS transistors in parallel adjusts the number of turned-on NMOS transistors based on the pull-down decoding signals NSEL0 to NSEL4 and the pull-down control signal DOWN_D outputted from the inside of the semiconductor memory device. As a result, the pull-down impedance of the DQ PAD 700 can be determined as shown in the step S114.

As above described, the semiconductor memory device in accordance with the embodiment of the present invention can perform the OCD calibration control operation by the EMRS control unit to thereby control the level of the first and the second reference signals outputted from the reference signal generating unit. Therefore, it is possible to easily control the pull-up and the pull-down impedances of the DQ PAD.

For example, assume that a default impedance for the OCD calibration control is set to a 40 ohm and the pull-up impedance of the DQ PAD 700 is also set to a 40 ohm. If the pull-up impedance of the DQ PAD 700 should be changed to a 30 ohm because of the specification of the semiconductor memory device, a conventional semiconductor memory device cannot change the pull-up impedance of the DQ PAD 700 easily. However, the present invention can easily change the pull-up impedance of the DQ PAD 700 to be the 30 ohm by changing the voltage level of the first reference signal Vref1 outputted from the reference signal generating unit 100.

Namely, first, the first reference signal Vref1 is outputted as the voltage level of (4*VDD)/7 so that the pull-up impedance of the DQ PAD 700 can be determined. In this time, even if an impedance of an external resistor RQ is a 40 ohm, the pull-up impedance of the DQ PAD 700 can be the 30 ohm. Then, the second reference signal Vref2 is outputted as the voltage level of the source voltage VDD divided by 2 so that the pull-down impedance of the DQ PAD 700 can be determined.

Figure 1:
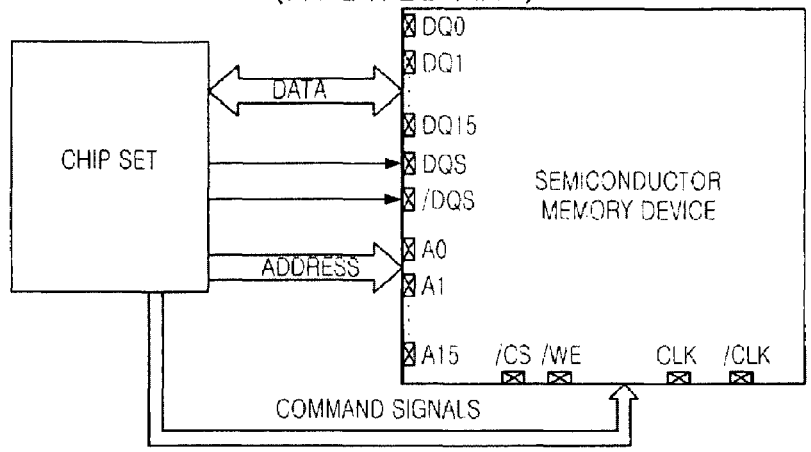
FIG. 1 is a block diagram showing a data interface between a chipset and a conventional DDR SDRAM.
Figure 2:
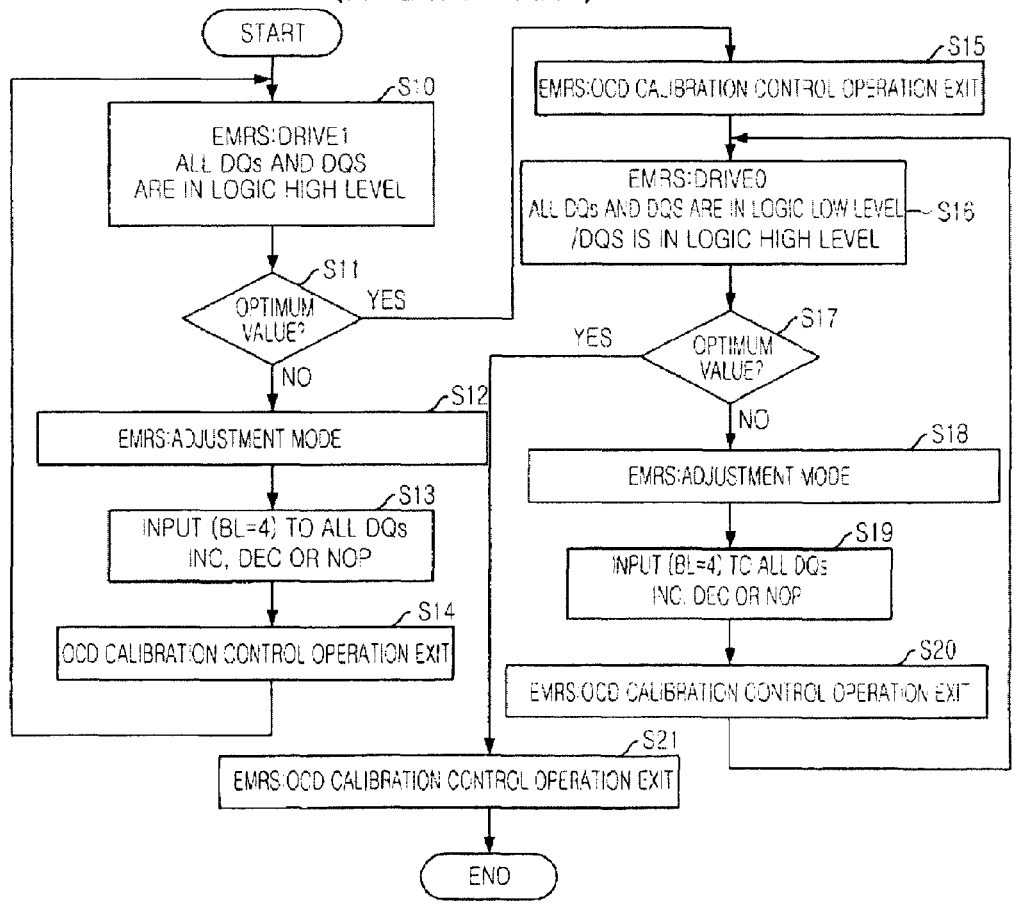
FIG. 2 is a flow chart showing an operational sequence of performing an OCD calibration control mode proposed by the JEDEC.
Figures 4A, 4B:
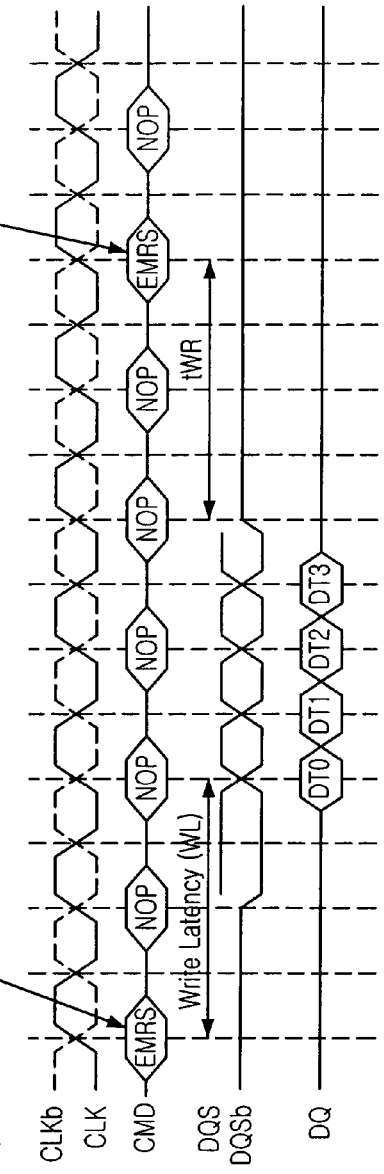
FIG. 4A is a timing diagram showing an operation of adjusting the output impedance of the data output driver.
FIG. 4B is an operation table showing an operation of performing the OCD calibration control mode in response to a burst code.
Figure 5:
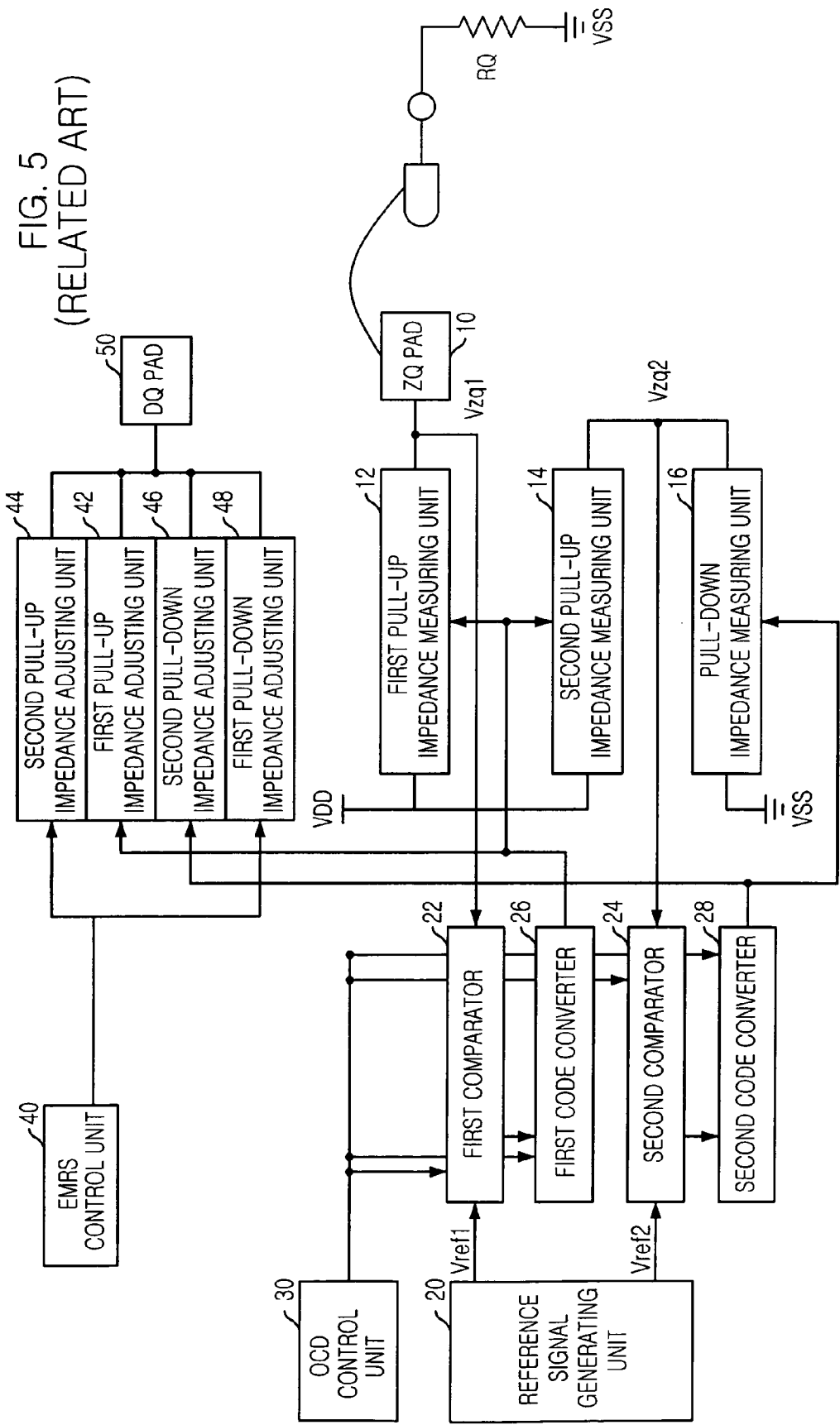
FIG. 5 is a block diagram depicting a device for performing the OCD calibration control in a conventional DDR SDRAM.

Accordingly, the second pull-up impedance adjusting unit 44 and the second pull-down impedance adjusting unit 48 of the conventional semiconductor memory device shown in FIG. 5 are not required in the present invention. As a result, it is possible to easily and exactly adjust the pull-up and the pull-down impedances by an EMRS setting.

Further, through the OCD operation is explained in the above embodiment, an ODT operation for controlling a termination impedance of the DQ PAD is also easily performed based on the above embodiment.

Moreover, it is possible for the reference signal generating unit to output a common reference signal instead of the first reference signal and the second reference signal. Hence, in case that the common reference signal is inputted to the first comparator, the common reference signal has a different voltage level from that of the common reference signal inputted to the second comparator.

The present application contains subject matter related to Korean patent application No. 2005-90063, filed in the Korean Patent Office on Sep. 27, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A device for adjusting an output impedance of a data output driver, comprising:
   a test pad;
   a data pad;
   an adjusted value outputting unit for comparing a reference signal with a test signal determined by measuring an impedance of the test pad and outputting an adjusted value after adjusting the adjusted value until the test signal is equal to the reference signal; and
   an impedance adjusting unit for adjusting an impedance of the data pad to have an impedance value corresponding to the adjusted value outputted when the test signal is equal to the reference signal,
   wherein a voltage level of the reference signal is varied according to a drive mode of a semiconductor device.

2. The device as recited in claim 1, wherein the adjusted value outputting unit includes:
   a comparing unit for comparing the reference signal with the test signal to output the adjusted value after adjusting the adjusted value until the test signal is equal to the reference signal;
   an impedance control unit for controlling the comparing unit so that the adjusted value is outputted when the test signal is equal to the reference signal; and
   an impedance measuring unit for measuring the impedance of the test pad based on the adjusted value to provide the test signal to the comparing unit.

3. The device as recited in claim 2, wherein the comparing unit includes:
   a first comparing unit for comparing a first reference signal with a first test signal applied to the test pad to thereby output a first adjusted value to the test pad after adjusting the first adjusted value until the first test signal is equal to the first reference signal; and
   a second comparing unit for comparing a second reference signal with a second test signal applied to the test pad to thereby output a second adjusted value to the test pad after adjusting the second adjusted value until the second test signal is equal to the second reference signal.

4. The device as recited in claim 3, wherein the first comparing unit includes:
   a first comparator for comparing the first reference signal with the first test signal to output a first comparison value; and
   a first code converter for decoding the first comparison value to supply pull-up decoding signals as the first adjusted value.

5. The device as recited in claim 4, wherein the first comparator includes:
   a first PMOS transistor having a source connected to a source voltage terminal and a drain connected to its gate to form a diode type;
   a second PMOS transistor having a gate connected to the gate of the first PMOS transistor and a source connected to the source voltage terminal to thereby form a current mirror with the first PMOS transistor;
   a first NMOS transistor having a gate to receive the first test signal and a drain connected to the drain of the first PMOS transistor;
   a second NMOS transistor having a gate to receive the first reference signal and a drain connected to a drain of the second PMOS transistor;
   a third NMOS transistor having a gate to receive a bias voltage, a drain connected to sources of the first and the second NMOS transistors, and a source connected to a ground voltage terminal to thereby form a current source; and
   a buffer for buffering a signal applied to the drain of the second NMOS transistor to output a buffering result as the first comparison value.

6. The device as recited in claim 3, wherein the second comparing unit includes:
   a second comparator for comparing the second reference signal with the second test signal to output a second comparison value; and
   a second code converter for decoding the second comparison value to supply pull-down decoding signals as the second adjusted value.

7. The device as recited in claim 3, wherein the impedance measuring unit includes:
   a first impedance measuring unit for adjusting a pull-up impedance of the test pad based on the first adjusted value;
   a second impedance measuring unit for supplying the second test signal to the second comparing unit based on the first adjusted value outputted when the first reference signal is equal to the first test signal; and
   a third impedance measuring unit for adjusting a pull-down impedance of the test pad based on the second adjusted value.

8. The device as recited in claim 7, wherein the first impedance measuring unit adjusts the pull-up impedance of the test pad by increasing the number of turned-on PMOS transistors of the first impedance measuring unit when the first reference signal is higher than the first test signal, thereby decreasing the pull-up impedance of the test pad, and decreasing the number of turned-on PMOS transistors of the first impedance measuring unit when the first reference signal is lower than the first test signal, thereby increasing the pull-up impedance of the test pad.

9. The device as recited in claim 7, wherein the third measuring unit adjusts the pull-down impedance of the test pad by increasing the number of turned-on NMOS transistors of the third impedance measuring unit when the second reference signal is higher than the second test signal, thereby decreasing the pull-down impedance of the test pad, and decreasing the number of turned-on NMOS transistors of the third impedance measuring unit when the second reference signal is lower than the second test signal, thereby increasing the pull-down impedance of the test pad.

10. The device as recited in claim 7, wherein the impedance adjusting unit includes:
    a pull-up impedance adjusting unit for adjusting a pull-up impedance of the data pad in response to the first adjusted value outputted when the first reference signal is equal to the first test signal; and a pull-down impedance adjusting unit for adjusting a pull-down impedance of the data pad in response to the second adjusted value outputted when the second reference signal is equal to the second test signal.

11. The device as recited in claim 10, wherein the pull-up impedance adjusting unit includes:

a plurality of NAND gates for receiving the first adjusted value and a pull-up control signal outputted from an inside of the semiconductor memory device; and a plurality of pull-up PMOS transistors for connecting the data pad to a source voltage terminal based on outputs of the NAND gates, respectively.

12. The device as recited in claim 11, wherein the pull-down impedance adjusting unit includes:

a plurality of NOR gates for receiving the second adjusted value and a pull-down control signal outputted from the inside of the semiconductor memory device; and a plurality of pull-down NMOS transistors for connecting the data pad to a ground voltage terminal based on outputs of the NOR gates, respectively.

13. The device as recited in claim 3, further comprising:

a reference signal generating unit for generating the reference signal including the first and the second reference signals; and a reference signal control unit for controlling the reference signal generating unit to adjust a voltage level of the reference signal.

14. The device as recited in claim 13, wherein the reference signal generating unit includes:

a plurality of resistors connected in series between a source voltage terminal and a ground voltage terminal;

a plurality of transfer gates to transfer a plurality of voltages divided by the resistors, which are selectively turned-on by the reference signal control unit; and an output unit for outputting an output of a predetermined transfer gate turned-on by the reference signal control unit as the first reference signal, wherein one of the plurality of voltages divided by the resistors, having a level of half of the source voltage, is set to the second reference signal.

15. The device as recited in claim 13, wherein the reference signal control unit controls the reference signal generating unit according to an extended mode register set (EMRS) output mode.

16. The device as recited in claim 1, wherein the drive mode of the semiconductor device is set by an EMRS output mode.

* * * * *